US009287193B2

(12) United States Patent
Orimoto

(10) Patent No.: US 9,287,193 B2
(45) Date of Patent: Mar. 15, 2016

(54) SEMICONDUCTOR DEVICE

(71) Applicant: TOYOTA JIDOSHA KABUSHIKI KAISHA, Toyota-shi, Aichi-ken (JP)

(72) Inventor: Norimune Orimoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/707,708

(22) Filed: May 8, 2015

(65) Prior Publication Data

US 2016/0005676 A1 Jan. 7, 2016

(30) Foreign Application Priority Data

Jul. 3, 2014 (JP) ................................. 2014-137615

(51) Int. Cl.
| | |
|---|---|
| H01L 23/34 | (2006.01) |
| H01L 23/10 | (2006.01) |
| H01L 23/367 | (2006.01) |
| H01L 25/065 | (2006.01) |
| H01L 23/373 | (2006.01) |
| H01L 23/42 | (2006.01) |
| H01L 23/31 | (2006.01) |
| H01L 23/473 | (2006.01) |

(52) U.S. Cl.
CPC ........ *H01L 23/3675* (2013.01); *H01L 23/3107* (2013.01); *H01L 23/3733* (2013.01); *H01L 23/3736* (2013.01); *H01L 23/42* (2013.01); *H01L 23/473* (2013.01); *H01L 25/0655* (2013.01)

(58) Field of Classification Search
CPC ......... H01L 23/36; H01L 23/42; H01L 23/46; H01L 23/367; H01L 23/3736; H01L 23/473

USPC ............................ 257/707, 713, 714, E23.101
See application file for complete search history.

(56) References Cited

U.S. PATENT DOCUMENTS

| | | | | |
|---|---|---|---|---|
| 6,434,000 | B1 * | 8/2002 | Pandolfi | F25B 21/02 136/204 |
| 7,019,395 | B2 * | 3/2006 | Hirano | H01L 23/4338 257/707 |
| 7,768,785 | B2 * | 8/2010 | Ni | H01L 23/367 257/707 |
| 8,184,439 | B2 * | 5/2012 | Baek | H01L 23/38 165/80.3 |
| 8,902,589 | B2 * | 12/2014 | Gohara | H01L 23/3735 165/104.19 |

(Continued)

FOREIGN PATENT DOCUMENTS

| | | |
|---|---|---|
| JP | 2012-028520 A | 2/2012 |
| JP | 2012-142547 A | 7/2012 |

*Primary Examiner* — Nitin Parekh
(74) *Attorney, Agent, or Firm* — Oliff PLC

(57) ABSTRACT

A semiconductor device 1 includes a thermal radiation member 4; a first semiconductor chip 21 connected to the thermal radiation member 4; a second semiconductor chip 22 connected to the thermal radiation member 4; and sealing resin 93 sealing the first semiconductor chip 21 and the second semiconductor chip 22. The semiconductor device 1 comprises a first thermal diffusion member 31 connected to the thermal radiation member 4; a second thermal diffusion member 32 connected to the thermal radiation member 4; and a cooler 5 configured to cool the first thermal diffusion member 31 and the second thermal diffusion member 32. A space between the first thermal diffusion member 31 and the second thermal diffusion member 32 is positioned to oppose a space between the first semiconductor chip 21 and the second semiconductor chip 22 via the thermal radiation member 4.

9 Claims, 11 Drawing Sheets

(56) References Cited

U.S. PATENT DOCUMENTS

| | | | |
|---|---|---|---|
| 2008/0013282 A1* | 1/2008 | Hoss | H01L 23/4093 361/715 |
| 2009/0129026 A1* | 5/2009 | Baek | H01L 23/3672 361/710 |
| 2012/0152510 A1 | 6/2012 | Noda et al. | |
| 2013/0050947 A1* | 2/2013 | Kadoguchi | H01L 23/051 361/715 |
| 2013/0198022 A1* | 8/2013 | Zhang | G06Q 30/0601 705/26.1 |
| 2013/0224891 A1* | 8/2013 | Takizawa | H01L 22/10 438/15 |
| 2015/0077941 A1* | 3/2015 | Hosseini | H01L 23/3733 361/704 |

* cited by examiner

SEMICONDUCTOR DEVICE

CROSS-REFERENCE TO RELATED APPLICATION

This application claims priority to Japanese Patent Application No. 2014-137615 filed on Jul. 3, 2014, the contents of which are hereby incorporated by reference into the present application.

TECHNICAL FIELD

The present application relates to a semiconductor device.

DESCRIPTION OF RELATED ART

A semiconductor device is disclosed in Japanese Patent Application Publication No. 2012-028520. The semiconductor device of Japanese Patent Application Publication No. 2012-028520 is provided with a plurality of semiconductor chips disposed to be spaced from each other, a graphite thermal diffusion plate fixed to the semiconductor chips, and a metal substrate fixed to the graphite thermal diffusion plate. The plurality of semiconductor chips is sealed with sealing resin.

In the semiconductor device of Japanese Patent Application Publication No. 2012-028520, the semiconductor chips generate heat by being energized. When the semiconductor chips repeatedly generate heat by the semiconductor device turning on and off, the sealing resin sealing the semiconductor chips expands and contracts, and the sealing resin may delaminate from the semiconductor chips. Further, in case of thermal treatment during manufacture of the semiconductor device, the sealing resin may contract and delaminate from the semiconductor chips.

BRIEF SUMMARY OF INVENTION

The present specification aims to present a semiconductor device capable of reducing delamination of the sealing resin. One aspect of the present disclosure provides a semiconductor device. The semiconductor device comprises a thermal radiation member made of metal and including a first surface and a second surface that is on an opposite side of the first surface; a first semiconductor chip connected to the first surface of the thermal radiation member; a second semiconductor chip spaced from the first semiconductor chip and connected to the first surface of the thermal radiation member; and sealing resin sealing the first semiconductor chip, the second semiconductor chip, and the first surface of the thermal radiation member between the first semiconductor chip and the second semiconductor chip. The semiconductor device further comprises a first thermal diffusion member made of carbon-based material and connected to the second surface of the thermal radiation member at a position opposed to the first semiconductor chip; a second thermal diffusion member made of carbon-based material and connected to the second surface of the thermal radiation member at a position opposed to the second semiconductor chip; and a cooler configured to cool the first thermal diffusion member and the second thermal diffusion member, and being disposed to face the second surface of the thermal radiation member. The first thermal diffusion member and the second thermal diffusion member are spaced from each other, and are disposed such that a space between the first thermal diffusion member and the second thermal diffusion member is positioned to oppose a space between the first semiconductor chip and the second semiconductor chip via the thermal radiation member.

According to the semiconductor device, when heat generated by the semiconductor chips is transmitted to the thermal diffusion members, thermal stress occurs in the thermal diffusion members. At this juncture, since the first thermal diffusion member and the second thermal diffusion member are spaced from each other, the first thermal diffusion member and the second thermal diffusion member can deform toward their space side, and thereby the thermal stress generated in the first thermal diffusion member and the second thermal diffusion member is reduced. Consequently, stress applied to the sealing resin from the first thermal diffusion member and the second thermal diffusion member is reduced and thereby the delamination of the sealing resin is suppressed.

Further, although high stress generally occurs readily between two semiconductor chips due to the sealing resin, in the semiconductor device described above, the first thermal diffusion member and the second thermal diffusion member are disposed such that the space between the first thermal diffusion member and the second thermal diffusion member is positioned to oppose the space between the first semiconductor chip and the second semiconductor chip. Therefore, the thermal radiation members disposed between the first semiconductor chip and the second semiconductor chip easily follow the expansion and contraction of the sealing resin. Consequently, it is possible to reduce the thermal stress of the sealing resin even between the first semiconductor chip and the second semiconductor chip, and the delamination of the sealing resin can be reduced.

DETAILED DESCRIPTION OF INVENTION

Embodiments will be described below with reference to the accompanying figures. In the description below, components that are the same in each component element will be described collectively, and duplicate description thereof may be omitted.

Figure 1:
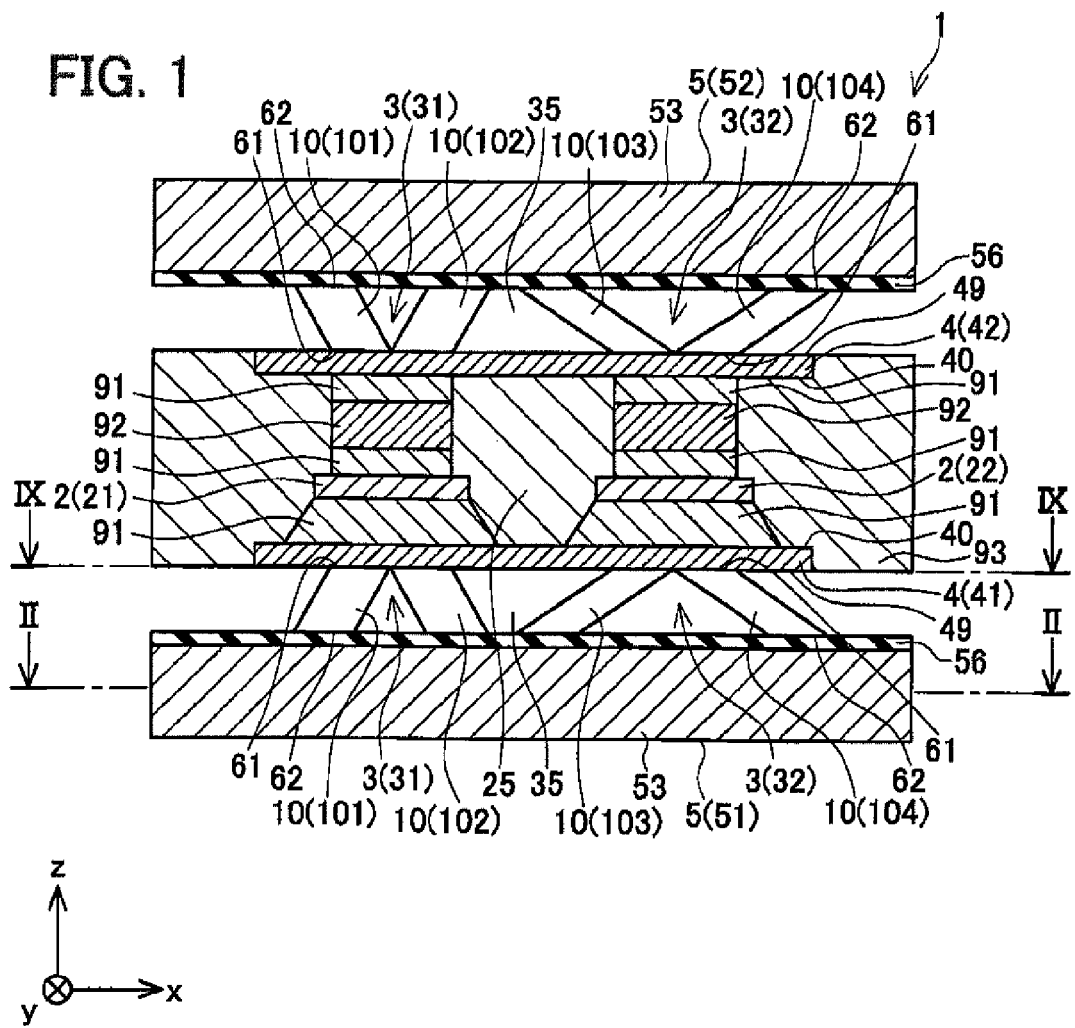
FIG. 1 is a cross-sectional view of a semiconductor device.

As shown in FIG. 1, a semiconductor device 1 of the present embodiment comprises a plurality of semiconductor chips 2 (a first semiconductor chip 21 and a second semiconductor chip 22), and a plurality of thermal radiation members 4 (a first thermal radiation member 41 and a second thermal radiation member 42). Further, the semiconductor device 1 comprises a plurality of thermal diffusion members 3 (first thermal diffusion members 31 and second thermal diffusion members 32), and a plurality of coolers 5 (a first cooler 51 and a second cooler 52).

For example, an IGBT (Insulated Gate Bipolar Transistor) or FWD (Free Wheeling Diode), etc. can be used as the semiconductor chips 2 (the first semiconductor chip 21 and the second semiconductor chip 22). In the case where an IGBT and FWD are used, for example, the first semiconductor chip 21 is the IGBT, the second semiconductor chip 22 is the FWD, and the first semiconductor chip 21 and the second semiconductor chip 22 can be arranged in a reverse conducting state. In the case where the semiconductor chips 2 are IGBTs, a gate region, emitter region, collector region, etc. (not shown) are formed within each of the semiconductor chips 2. Further, in the case where the semiconductor chips 2 are FWDs, an anode region, a cathode region, etc. (not shown) are formed within each of the semiconductor chips 2.

The plurality of semiconductor chips 2 (the first semiconductor chip 21 and the second semiconductor chip 22) is disposed between the plurality of thermal radiation members 4 (the first thermal radiation member 41 and the second thermal radiation member 42). The first semiconductor chip 21 and the second semiconductor chip 22 are disposed abreast. The first semiconductor chip 21 and the second semiconductor chip 22 are disposed apart from one another and adjacent in a left and right direction. The first semiconductor chip 21 is spaced from the second semiconductor chip 22. The second semiconductor chip 22 is spaced from the first semiconductor chip 21. In the example shown in FIG. 1, the first semiconductor chip 21 is disposed at the left side, and the second semiconductor chip 22 is disposed at the right side. A space portion 25 is formed between the first semiconductor chip 21 and the second semiconductor chip 22. The first semiconductor chip 21 and the second semiconductor chip 22 are connected respectively to surfaces 40 of the thermal radiation members 4 (the first thermal radiation member 41 and the second thermal radiation member 42).

Metal plate or metal foil such as, for example, copper (Cu), aluminum (Al), etc. can be used as the thermal radiation members 4 (the first thermal radiation member 41 and the second thermal radiation member 42). The thermal radiation members 4 have thermal conductivity and electrical conductivity. The first thermal radiation member 41 and the second thermal radiation member 42 are disposed abreast with a space therebetween. The first thermal radiation member 41 and the second thermal radiation member 42 are disposed apart from one another and adjacent in an above and below direction. In the example shown in FIG. 1, the first thermal radiation member 41 is disposed at a lower side, and the second thermal radiation member 42 is disposed at an upper side. The first thermal radiation member 41 is disposed below the plurality of semiconductor chips 2, and the second thermal radiation member 42 is disposed above the plurality of semiconductor chips 2. The first thermal radiation member 41 is fixed to a lower surface of the first semiconductor chip 21 and a lower surface of the second semiconductor chip 22. The second thermal radiation member 42 is fixed to an upper surface of the first semiconductor chip 21 and an upper surface of the second semiconductor chip 22.

The lower side first thermal radiation member 41 and each of the semiconductor chips 2 (the first semiconductor chip 21 and the second semiconductor chip 22) are respectively joined by solder 91. A spacer 92 is positioned between the upper side second thermal radiation member 42 and each of the semiconductor chips 2 (the first semiconductor chip 21 and the second semiconductor chip 22). A block body of metal such as, for example, copper (Cu), aluminum (Al), etc. can be used as the spacers 92. The spacers 92 and the semiconductor chips 2 (the first semiconductor chip 21 and the second semiconductor chip 22) are each joined by the solder 91. The upper side second thermal radiation member 42 and the spacers 92 are each joined by the solder 91.

Sealing resin 93 is filled between the first thermal radiation member 41 and the second thermal radiation member 42. The sealing resin 93 has an insulating property. Epoxy resin, for example, can be used as the material of the sealing resin 93. The sealing resin 93 seals the semiconductor chips 2 (the first semiconductor chip 21 and the second semiconductor chip 22). Further, the sealing resin 93 seals an upper surface of the first thermal radiation member 41 and a lower surface of the second thermal radiation member 42. That is, the sealing resin 93 seals the surfaces 40 of the thermal radiation members 4 between the first semiconductor chip 21 and the second semiconductor chip 22. The sealing resin 93 is filled in the space portion 25 between the first semiconductor chip 21 and the second semiconductor chip 22. Surfaces of the first thermal radiation member 41 and the second thermal radiation member 42 positioned in the space portion 25 are also sealed by the sealing resin 93.

The first thermal radiation member 41 is connected to the first cooler 51 via the thermal diffusion members 3 and an insulating member 56. The second thermal radiation member 42 is connected to the second cooler 52 via the thermal diffusion members 3 and the insulating member 56. The thermal diffusion members 3 will be described in detail later.

The insulating member 56 is disposed at a surface of a housing 53 of each cooler 5. Each insulating member 56 is disposed between the corresponding cooler 5 and thermal diffusion members 3 (the corresponding first thermal diffusion member 31 and second thermal diffusion member 32). The insulating members 56 are formed from a resin having an insulating property. The insulating members 56 insulate the coolers 5 and the thermal diffusion members 3.

Each cooler 5 is fixed to a surface of the corresponding insulating member 56 positioned at an opposing side to the thermal diffusion members 3. The cooler 5 is fixed to the thermal diffusion members 3 via the insulating member 56. The cooler 5 cools the first thermal diffusion member 31 and the second thermal diffusion member 32 by using flowing coolant.

Figure 2:
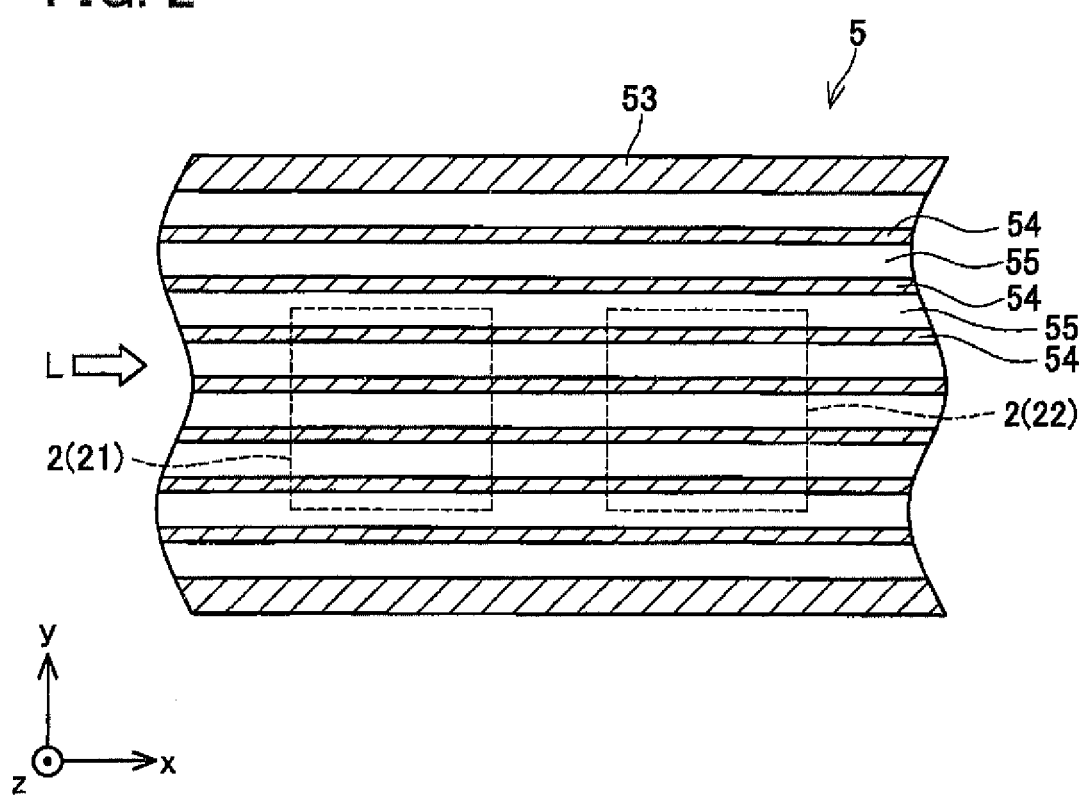
FIG. 2 is a cross-sectional view of II-II of FIG. 1.

As shown in FIG. 2, each cooler 5 comprises the housing 53, and a plurality of partition walls 54 disposed within the housing 53. The second cooler 52 has the same configuration as the first cooler 51. The housing 53 surrounds the plurality of partition walls 54. The plurality of partition walls 54 is disposed abreast spaced from each other. The plurality of partition walls 54 extend in parallel. A passage 55 is formed between the partition wall 54 and the partition wall 54. The plurality of passages 55 is formed abreast spaced from each other. The plurality of passages 55 extends in parallel. The passages 55 extend along the direction in which the first semiconductor chip 21 and the second semiconductor chip 22 are arranged. A liquid coolant such as water, for example, flows through the interior of the housing 53. The coolant flows through the passages 55 along the partition walls 54. As shown by the arrow L in FIG. 2, the coolant flows from the side where the first semiconductor chip 21 is positioned toward the side where the second semiconductor chip 22 is positioned. The first semiconductor chip 21 is positioned at an upstream side in the flowing direction L of the coolant within the cooler 5, and the second semiconductor chip 22 is positioned at a downstream side.

The thermal diffusion members 3 (the first thermal diffusion members 31 and the second thermal diffusion members 32) are fixed to the thermal radiation members 4 at respectively opposing sides to the semiconductor chips 2. The first thermal diffusion members 31 are connected to the thermal radiation members 4 at positions opposing the first semiconductor chip 21. The second thermal diffusion members 32 are connected to the thermal radiation members 4 at positions opposing the second semiconductor chip 22. The first thermal diffusion members 31 and the second thermal diffusion members 32 comprise respective slant members 10 (a first slant member 101 and a second slant member 102, or a third slant member 103 and a fourth slant member 104). Each first thermal diffusion member 31 comprises the first slant member 101 and the second slant member 102. Each second thermal diffusion member 32 comprises the third slant member 103 and the fourth slant member 104. Each first thermal diffusion member 31 is formed by combining the first slant member 101 and the second slant member 102. Further, each second thermal diffusion member 32 is formed by combining the third slant member 103 and the fourth slant member 104. The first slant member 101, the second slant member 102, the third slant member 103, and the fourth slant member 104 are arranged in a different orientation, but have the same configuration.

Figure 3:
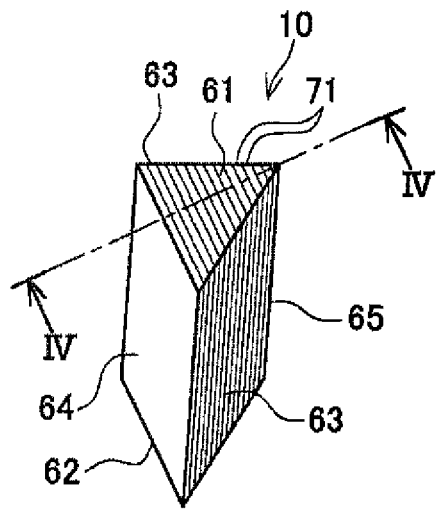
FIG. 3 is a perspective view of a thermal diffusion member.
Figure 4:
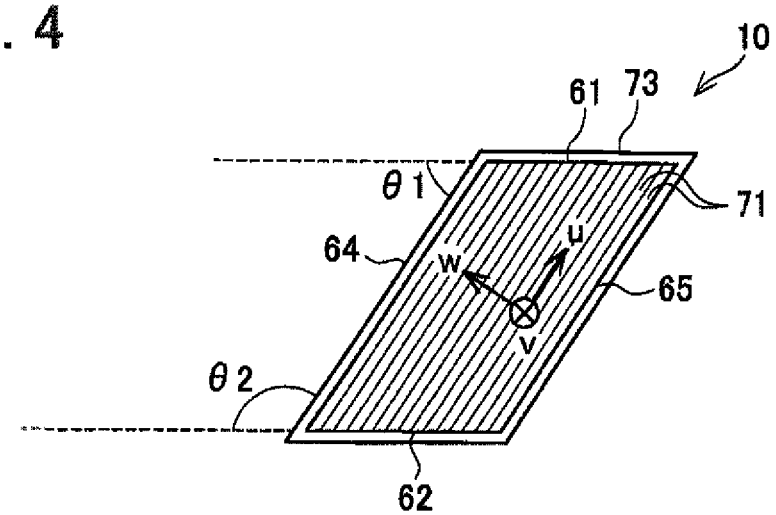
FIG. 4 is a cross-sectional view of IV-IV of FIG. 3.

As shown in FIG. 3 and FIG. 4, the slant members 10 (the first slant member 101, the second slant member 102, the third slant member 103, the fourth slant member 104) comprise a plurality of sheet members 71. The plurality of sheet members 71 is stacked. Each slant member 10 is formed by the plurality of sheet members 71 being stacked. The sheet members 71 are formed from carbon-based material. Thus, the slant members 10 and the thermal diffusion members 3 include carbon-based material. For example, graphite, graphene, fullerenes, carbon nanotubes, etc. can be used as the carbon-based material. In the present embodiment, graphite is used as the carbon-based material. A surface of each slant member 10 is covered by a thin film 73. The thin film 73 covers the entire surface of the slant member 10. The thin film 73 is formed from metal. In the present embodiment, the thin film 73 is formed from nickel.

Each slant member 10 comprises one end face 61, an other end face 62, side faces 63, a rear face 64 and a front end portion 65. As shown in FIG. 4, an angle θ1 between the one end face 61 and the rear face 64 of the thermal diffusion member 3 is preferably 30° to 60°, and is more preferably 45°. Further, an angle θ2 between the other end face 62 and the rear face 64 of the thermal diffusion member 3 is preferably 120° to 150°, and is more preferably 135°. The one end face 61 and the other end face 62 are formed in a triangular shape.

Figure 5:
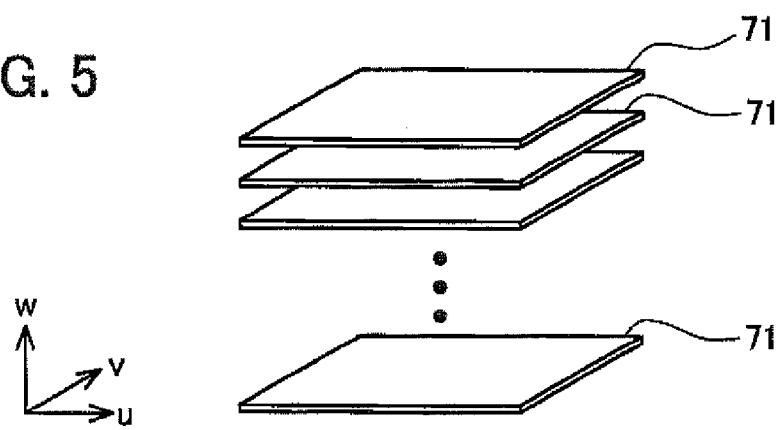
FIG. 5 is a figure for describing a manufacturing method of the thermal diffusion member (1)
Figure 6:
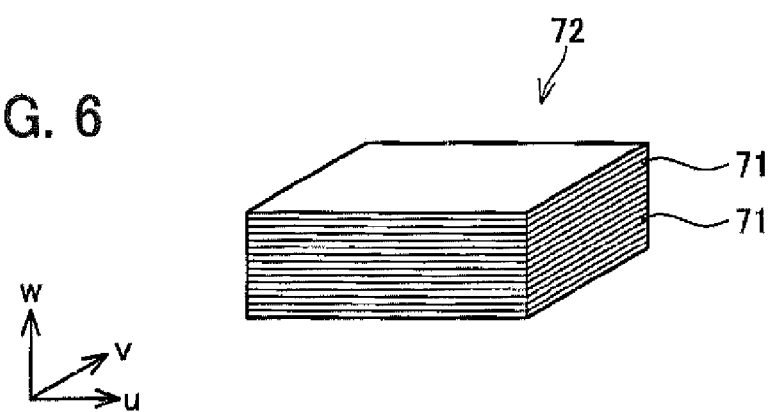
FIG. 6 is a figure for describing the manufacturing method of the thermal diffusion member (2)
Figure 7:
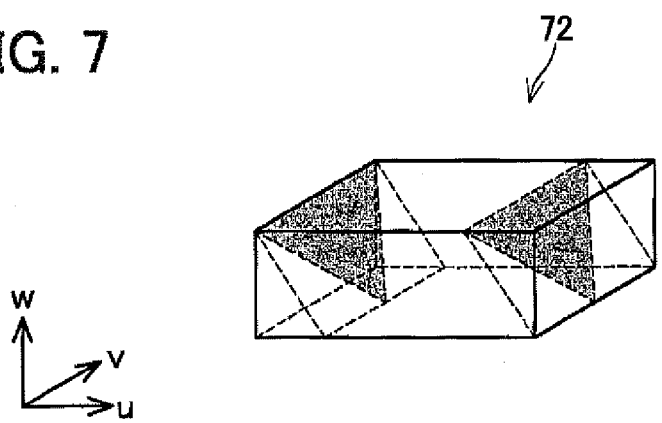
FIG. 7 is a figure for describing the manufacturing method of the thermal diffusion member (3)
Figure 8:
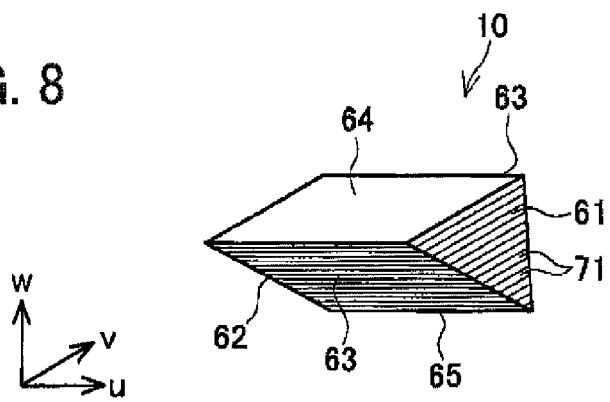
FIG. 8 is a figure for describing the manufacturing method of the thermal diffusion member (4)

Each slant member 10 is manufactured, for example, as follows. As shown in FIG. 5 and FIG. 6, when manufacturing the thermal diffusion members 3, the plurality of sheet members 71 are first stacked to form a stacked body 72. From a top view, the sheet members 71 are generally rectangular. After the stacked body 72 has been formed, as shown in FIG. 7, an end portion of the stacked body 72 is cut obliquely with respect to the surface of the sheet members 71. The slant member 10 is formed when the stacked body 72 is cut, as shown in FIG. 8. Thus, the thermal diffusion members 3 made of carbon-based material can be manufactured.

The sheet members 71 have anisotropic thermal conductivity. The thermal conductivity of the sheet members 71 is dependent on the orientation of the crystals of the carbon-based material. The thermal conductivity of the sheet members 71 is low in the stacking direction of the plurality of sheet members 71 (w direction of FIG. 4 to FIG. 8). In directions orthogonal to the stacking direction of the plurality of sheet members 71 (u direction and v direction of FIG. 4 to FIG. 8), the thermal conductivity of the sheet members 71 is higher than the thermal conductivity of the sheet members 71 in the stacking direction (w direction). That is, the thermal conductivity of the sheet members 71 is low in a thickness direction of the sheet members 71, and the thermal conductivity of the sheet members 71 in a surface direction (direction along the surface) of the sheet members 71 is higher than the thermal conductivity in the thickness direction. The w direction of FIG. 4 to FIG. 8 corresponds to a low thermal conductivity direction, the u direction corresponds to a first high thermal conductivity direction, and the v direction corresponds to a second high thermal conductivity direction. The low thermal conductivity direction (w direction), the first high thermal conductivity direction (u direction), and the second high thermal conductivity direction (v direction) are orthogonal to each other. In the case where graphite is used as the carbon-based material, thermal conductivity in the low thermal conductivity direction (w direction) of FIG. 4 to FIG. 8 is approximately 7 W/mK, thermal conductivity in the first high thermal conductivity direction (u direction) is approximately 1700 W/mK, and thermal conductivity in the second high thermal conductivity direction (v direction) is approximately 1700 W/mK. Thus, the sheet members 71 have different thermal conductivity in three directions. Thermal conductivity in the high thermal conductivity direction of carbon-based material is higher than the thermal conductivity of metal. For example, the thermal conductivity of oxygen-free copper, which is a metal, is approximately 385 W/mK.

Because the sheet members 71 have anisotropic thermal conductivity, each slant member 10 also has anisotropic thermal conductivity. A direction from the front end portion 65 toward the rear face 64 of the slant member 10 (w direction of FIG. 4) corresponds to the low thermal conductivity direction, and thermal conductivity in this direction is low. A direction from the one end face 61 toward the other end face 62 of the slant member 10 (u direction of FIG. 4) corresponds to the first high thermal conductivity direction, and thermal conductivity in this direction is higher than the thermal conductivity of the low thermal conductivity direction (w direction). A direction from the one side face 63 toward the other side face 63 of the slant member 10 (v direction of FIG. 4) corresponds to the second high thermal conductivity direction, and thermal conductivity in this direction is higher than the thermal conductivity of the low thermal conductivity direction (w direction).

Figure 9:
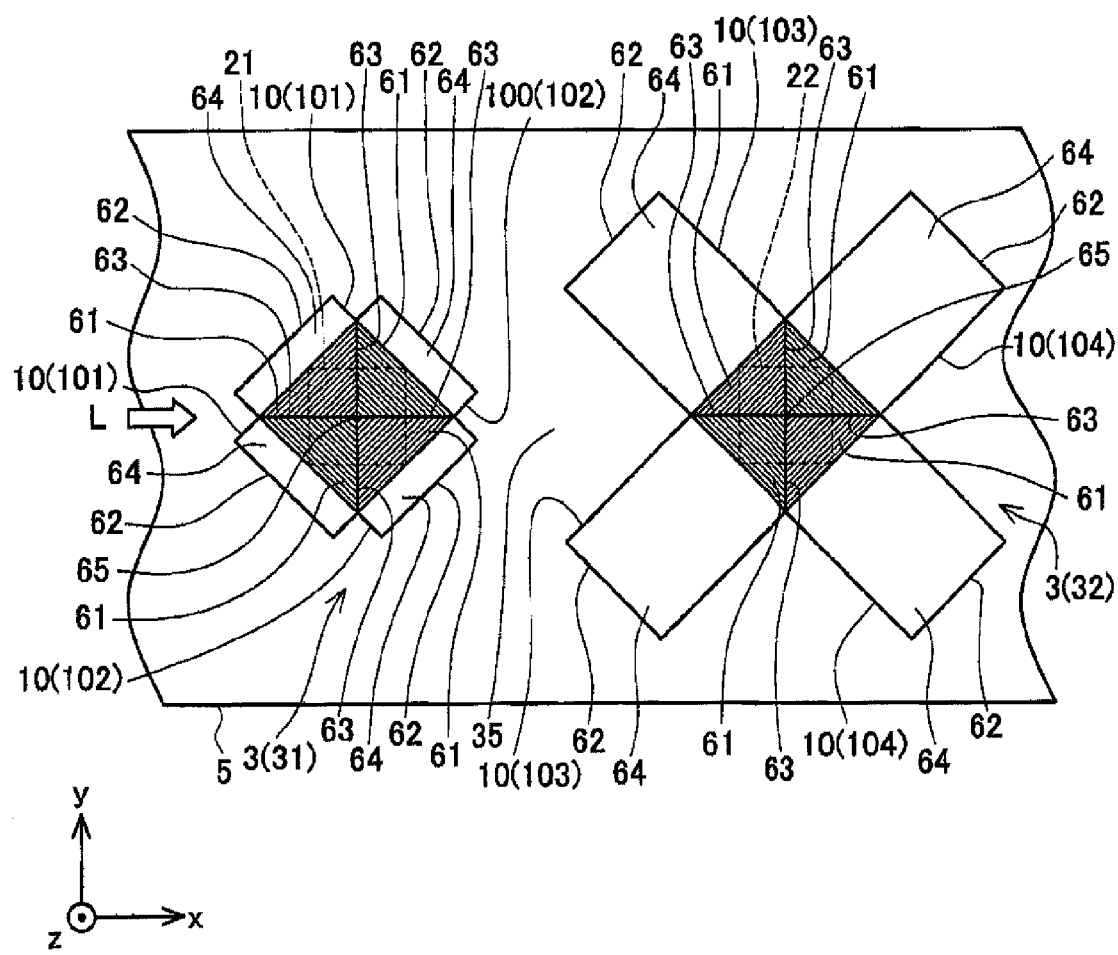
FIG. 9 is a cross-sectional view of IX-IX of FIG. 1.

As shown in FIG. 9, the plurality of slant members 10 is disposed abreast. The plurality of slant members 10 is disposed in a state facing different directions. The plurality of slant members 10 is disposed opposite each other. The plurality of slant members 10 is disposed in a state where the respective front end portions 65 are opposite each other. Each first thermal diffusion member 31 is formed by disposing the first slant member 101 and the second slant member 102 abreast and opposite each other in a state of facing different directions. Further, each second thermal diffusion member 32 is formed by disposing the third slant member 103 and the fourth slant member 104 abreast and opposite each other in a state of facing different directions.

As shown in FIG. 1 and FIG. 9, the first thermal diffusion members 31 and the second thermal diffusion members 32 are disposed abreast spaced from each other. The first thermal diffusion members 31 and the second thermal diffusion members 32 are disposed adjacent along the left and right direction. In the example shown in FIG. 1, the plurality of first thermal diffusion members 31 is disposed at the left side, and the plurality of second thermal diffusion members 32 is disposed at the right side.

The first thermal diffusion members 31 are disposed to correspond to the first semiconductor chip 21. The first thermal diffusion members 31 are disposed respectively above and below the first semiconductor chip 21. The first thermal diffusion members 31 are disposed at a position opposing the first semiconductor chip 21 via the thermal radiation members 4. The first thermal diffusion members 31 are disposed at a position overlapping with the first semiconductor chip 21 in the thickness direction of the first semiconductor chip 21 (z direction of FIG. 1). The first thermal diffusion members 31 are disposed between the thermal radiation members 4 and the coolers 5. The first thermal diffusion members 31 are connected to a back surface 49 of the corresponding thermal radiation members 4 (the first thermal radiation member 41 and the second thermal radiation member 42). One end of the first thermal diffusion members 31 is connected to the corresponding thermal radiation member 4 at a position opposing the first semiconductor chip 21. Another end of the first thermal diffusion members 31 is connected to the insulating member 56. Similarly, the second thermal diffusion members 32 are disposed to correspond to the second semiconductor chip 22. The second thermal diffusion members 32 are disposed respectively above and below the second semiconductor chip 22. The second thermal diffusion members 32 are disposed at a position opposing the second semiconductor chip 22 via the thermal radiation members 4. The second thermal diffusion members 32 are disposed at a position overlapping with the second semiconductor chip 22 in the thickness direction of the second semiconductor chip 22 (z direction of FIG. 1). The second thermal diffusion members 32 are connected to the back surface 49 of the corresponding thermal radiation members 4 (the first thermal radiation member 41 and the second thermal radiation member 42). One end of each of the second thermal diffusion members 32 is connected to the corresponding thermal radiation member 4 at a position opposing the second semiconductor chip 22. Another end of each of the second thermal diffusion members 32 is connected to the insulating member 56.

The plurality of slant members 10 configuring the thermal diffusion members 3 is disposed so as to expand obliquely from the thermal radiation members 4 toward the corresponding coolers 5. The plurality of slant members 10 (the first slant members 101, the second slant members 102, the third slant members 103, the fourth slant members 104) each extends from the thermal radiation member 4 toward the cooler 5 in a slanted state relative to the thermal radiation member 4. In the present embodiment, each slant member 10 is inclined at 450 with respect to the thermal radiation member 4 and the cooler 5. Further, the first high thermal conductivity direction of each slant member 10 (u direction of FIG. 4) is inclined at 450 with respect to the thermal radiation member 4 and the cooler 5. The first high thermal conductivity direction extends in a direction from the thermal radiation member 4 toward the cooler 5. That is, the first high thermal conductivity direction matches the longitudinal direction of each slant member 10, and heat is transferred at high thermal conductivity from the thermal radiation member 4 toward the insulating member 56. On the other hand, the second high thermal conductivity direction of each slant member 10 (v direction of FIG. 4) extends parallel to the thermal radiation member 4 and the cooler 5.

The first slant members 101 and the second slant members 102 configuring the first thermal diffusion members 31 are inclined in mutually different directions. In the examples shown in FIG. 1 and FIG. 9, the first slant members 101 extend obliquely leftward from the thermal radiation members 4 toward the cooler 5. On the other hand, the second slant members 102 extend obliquely rightward from the thermal radiation members 4 toward the coolers 5. Each first slant member 101 is inclined so as to separate from the second slant member 102 with larger distance in the x direction in between them, from the thermal radiation member 4 side toward the cooler 5 side. Each second slant member 102 is inclined so as to separate from the first slant member 101 with larger distance in the x direction in between them, from the thermal radiation member 4 side toward the cooler 5 side. That is, the space between the first slant member 101 and the second slant member 102 is wider at the cooler 5 side than at the thermal radiation member 4 side.

The third slant members 103 and the fourth slant members 104 configuring the second thermal diffusion members 32 are inclined in mutually different directions. In the examples shown in FIG. 1 and FIG. 9, the third slant members 103 extend obliquely left from the thermal radiation members 4 toward the coolers 5. On the other hand, the fourth slant members 104 extend obliquely right from the thermal radiation members 4 toward the coolers 5. Each third slant member 103 is inclined so as to separate from the fourth slant member 104 from the thermal radiation member 4 side toward the cooler 5 side. Each fourth slant member 104 is inclined so as to separate from the third slant member 103 from the thermal radiation member 4 side toward the cooler 5 side. That is, the space between the third slant member 103 and the fourth slant member 104 is wider at the cooler 5 side than at the thermal radiation member 4 side.

A space portion 35 is formed between the adjacent first thermal diffusion members 31 and second thermal diffusion members 32. The spaces (the space portions 35) between the first thermal diffusion members 31 and the second thermal diffusion members 32 are formed to correspond to the space (the space portion 25) between the first semiconductor chip 21 and the second semiconductor chip 22. The spaces (the space portions 35) between the first thermal diffusion members 31 and the second thermal diffusion members 32 are disposed, via the thermal radiation members 4, at a position opposing the space (the space portion 25) between the first semiconductor chip 21 and the second semiconductor chip 22. The space portions 35 of the thermal diffusion members 3 are formed above and below the space portion 25 of the semiconductor chips 2. The space portions 35 of the thermal diffusion members 3 are formed at a position overlapping with the space portion 25 of the semiconductor chips 2 in the vertical direction (z direction of FIG. 1).

As shown in FIG. 1, the thermal diffusion members 3 make contact with the thermal radiation members 4. Further, the thermal diffusion members 3 make contact with the coolers 5. Each of the slant members 10 configuring the thermal diffusion members 3 has a thermal radiation member 4 side end face, and a cooler 5 side end face. The one end face 61 of each slant member 10 corresponds to the thermal radiation member 4 side end face, and the other end face 62 corresponds to the cooler 5 side end face. One end face of each thermal diffusion member 3, i.e., the one end face 61 of the slant member 10, makes contact with the thermal radiation member 4. One end face of each thermal diffusion member 3, i.e., the one end face 61 of the slant member 10, faces the thermal radiation member 4 side. The thermal diffusion members 3 are fixed to the thermal radiation members 4 by brazing or soldering. Another end face of each thermal diffusion member 3, i.e., the other end face 62 of the slant member 10, is connected to the cooler 5 via the insulating member 56. The other end face of each thermal diffusion member 3, i.e., the other end face 62 of the slant member 10, faces the cooler 5 side.

Figure 10:
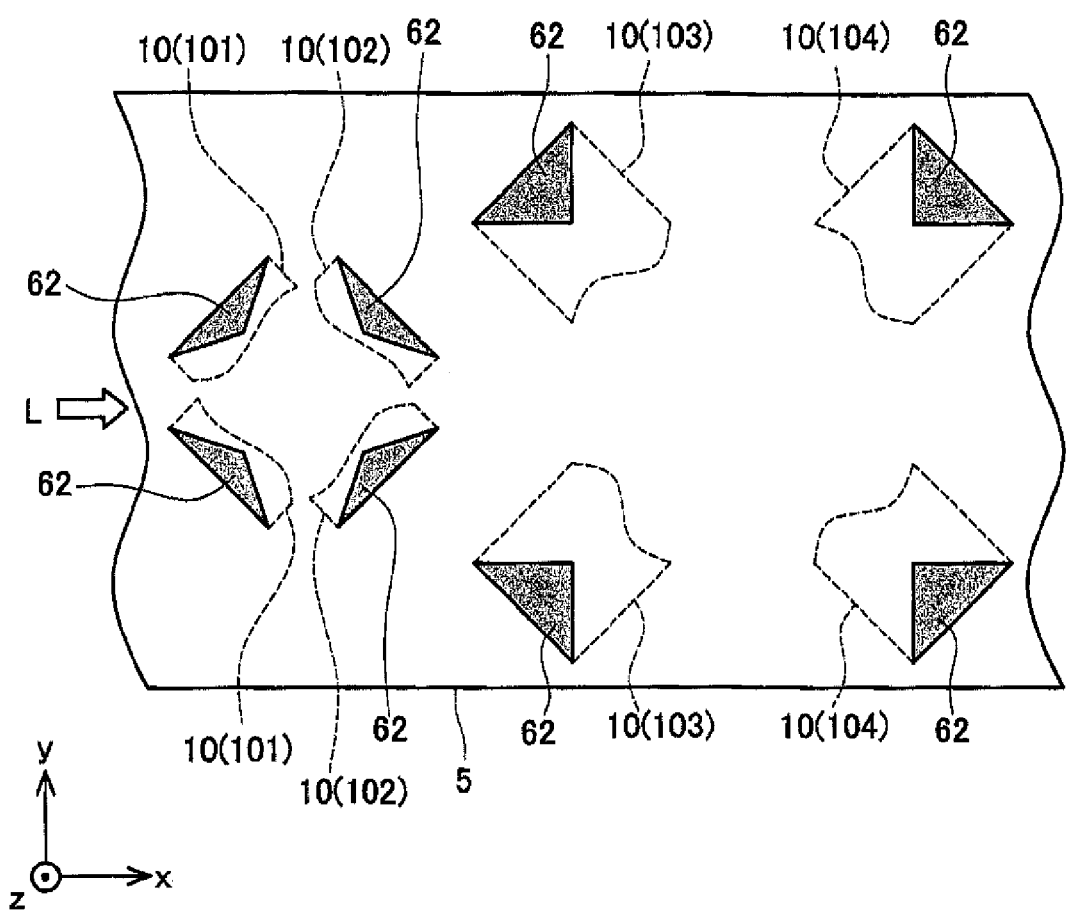
FIG. 10 is a figure for schematically showing the relationship between other end faces of the thermal diffusion member and the flowing direction of the coolant.

As shown in FIG. 9 and FIG. 10, the positions of the other end faces 62 of the first slant members 101 and the other end faces 62 of the second slant members 102 configuring the first thermal diffusion member 31, and the positions of the other end faces 62 of the third slant members 103 and the other end faces 62 of the fourth slant members 104 configuring the second thermal diffusion member 32, do not overlap each other in the flowing direction L of the coolant. That is, the position of the cooler 5 side end faces of the first thermal diffusion member 31 and the position of the cooler 5 side end faces of the second thermal diffusion member 32 are spaced apart in a direction intersecting with the flowing direction L of the coolant within the cooler 5. The position of the cooler 5 side end faces of the first thermal diffusion member 31 and the position of the cooler 5 side end faces of the second thermal diffusion member 32 do not overlap each other in the flowing direction L of the coolant within the cooler 5.

According to the semiconductor device 1 described above, when the semiconductor chips 2 (the first semiconductor chip 21 and the second semiconductor chip 22) generate heat by being energized, the heat of the semiconductor chips 2 is transmitted to the thermal radiation members 4 (the first thermal radiation member 41 and the second thermal radiation member 42) via the solder 91 and the spacers 92. The heat transmitted to the thermal radiation members 4 is transmitted to the thermal diffusion members 3 (the first thermal diffusion members 31 and the second thermal diffusion members 32) connected to the thermal radiation members 4. On the other hand, the thermal diffusion members 3 (the first thermal diffusion members 31 and the second thermal diffusion members 32) are cooled by the coolers 5 (the first cooler 51 and the second cooler 52) in contact with the thermal diffusion members 3. Thus, the heat generated by the semiconductor chips 2 is transmitted to the thermal diffusion members 3, and the thermal diffusion members 3 are cooled by the coolers 5. Thereby, the semiconductor chips 2 can be cooled.

When the heat generation of the semiconductor chips 2 is repeated, the expansion and contraction of the sealing resin 93 sealing the semiconductor chips 2 and the thermal radiation members 4 is repeated, and thereby the sealing resin 93 is subjected to stress in the direction of delamination from the semiconductor chips 2 or the thermal radiation members 4. In particular, the expansion and contraction of the sealing resin 93 is likely to be greater in a portion between the first semiconductor chip 21 and the second semiconductor chip 22, and the stress subjected on the sealing resin 93 increases.

The aforementioned semiconductor device 1 comprises the carbon-based material thermal diffusion members 3 (the first thermal diffusion members 31 and the second thermal diffusion members 32) connected to the metal thermal radiation members 4. In this semiconductor device 1, the heat transmitted from the semiconductor chips 2 to the metal thermal radiation members 4 is transmitted from the thermal radiation members 4 to the carbon-based material thermal diffusion members 3. Then, the thermal diffusion members 3 are cooled by the coolers 5. At this juncture, since the thermal conductivity of carbon-based material is higher than the thermal conductivity of metal, the cooling effect can be enhanced by cooling the carbon-based material thermal diffusion members 3. Further, disposing the thermal diffusion members 3, which are of carbon-based material rather than metal, allows the thickness to be reduced of the thermal radiation members 4, which are made of metal, and allows the rigidity of the thermal radiation members 4 to be reduced. Thus, even when the sealing resin 93 which seals the semiconductor chips 2 and the thermal radiation members 4 is subjected to repeated expansion and contraction, due to the rigidity of the thermal radiation members 4 having been reduced, consequently the thermal radiation members 4 can bend following the sealing resin 93. Thereby, the stress applied to the sealing resin 93 can be reduced, and the delamination of the sealing resin 93 can be suppressed.

Further, when the heat generated by the semiconductor chips 2 is transmitted to the thermal diffusion members 3 (the first thermal diffusion members 31 and the second thermal diffusion members 32), thermal stress occurs in the thermal diffusion members 3. At this juncture, according to the semiconductor device 1, the first thermal diffusion members 31 and the second thermal diffusion members 32 are disposed to be spaced from each other and, since the space portions 35 are formed, the influence of the thermal stress occurring in the thermal diffusion members 3 can be reduced by these space portions 35. That is, since the thermal diffusion members 3 can bend to the space portion 35 side when stress occurs, the stress occurring in the thermal diffusion members 3 can be reduced. Thereby, it is possible to reduce the influence of the thermal stress of the thermal diffusion members 3, exerted by these thermal diffusion members 3 on the thermal radiation members 4 to which they are connected, and it becomes easy for the thermal radiation members 4 to bend following the expansion and contraction of the sealing resin 93. Thus, the delamination of the sealing resin 93 can be further reduced.

Further, the first thermal diffusion members 31 and the second thermal diffusion members 32 are positioned such that the space portions 35 between the first thermal diffusion members 31 and the second thermal diffusion members 32 are positioned opposing the space portion 25 between the first semiconductor chip 21 and the second semiconductor chip 22, and consequently the thermal radiation members 4 between the first semiconductor chip 21 and the second semiconductor chip 22 are not constrained by the thermal diffusion members 3. Thus, the thermal radiation members 4, between the first semiconductor chip 21 and the second semiconductor chip 22, easily bend following the expansion and contraction of the sealing resin 93. By having the thermal radiation members 4 easily bend in the region between the first semiconductor chip 21 and the second semiconductor chip 22, in which high stress readily occurs, stress can be reduced even in this region. Thus, the delamination of the sealing resin 93 can be suppressed.

Further, in the semiconductor device 1, it is possible to reduce the thickness of the thermal radiation members 4, and since the thickness can be made substantially constant, the manufacturing cost of the semiconductor device 1 can be reduced.

Further, since the plurality of slant members 10 configuring the thermal diffusion members 3 is disposed in the slanted state relative to the thermal radiation members 4, the heat transmitted from the thermal radiation members 4 to the thermal diffusion members 3 can be diffused by the inclination of the slant members 10. Thereby, the cooling effect can be enhanced. That is, the first slant members 101 and the second slant members 102 configuring the first thermal diffusion members 31 extend from the thermal radiation members 4 toward the coolers 5 in the slanted state such that the first slant members 101 and the second slant members 102 are further separated as they extend away from the thermal radiation member 4 side toward the opposing cooler 5 side. Thus, heat transmitted from the thermal radiation members 4 to the first thermal diffusion members 31 (the first slant members 101 and the second slant members 102) is diffused, and the diffused heat is transmitted to the coolers 5. Consequently, since the heat cools upon diffusion, the cooling effect can be enhanced. Further, similarly, the third slant members 103 and the fourth slant members 104 configuring the second thermal diffusion members 32 extend from the thermal radiation members 4 toward the coolers 5 in a slanted state such that the third slant members 103 and the fourth slant members 104 are further separated as they extend away from the thermal radiation member 4 side toward the opposing cooler 5 side. Thereby, the cooling effect can be enhanced.

Further, in the semiconductor device 1, the position of the end faces of the first thermal diffusion members 31 at the cooler 5 side and the position of the end faces of the second thermal diffusion members 32 at the cooler 5 side are offset in the direction intersecting with the flowing direction L of the coolant within the cooler 5. Thereby, since the position of the end faces making contact with the coolers 5 do not overlap each other in the flowing direction L of the coolant in the first thermal diffusion members 31 and the second thermal diffusion members 32, the cooling effect can be enhanced. That is, when the position of the end faces of the first thermal diffusion members 31 at the cooler 5 side and the position of the end faces of the second thermal diffusion members 32 at the cooler 5 side overlap each other in the flowing direction L of the coolant, the second thermal diffusion members 32 are cooled by the coolant that has cooled the first thermal diffusion members 31, and consequently it is difficult to enhance the cooling effect. However, when the position of the end faces of the first thermal diffusion members 31 at the cooler 5 side and the position of the end faces of the second thermal diffusion members 32 at the cooler 5 side do not overlap each other in the flowing direction L of the coolant, the first thermal diffusion members 31 and the second thermal diffusion members 32 can each be cooled by fresh coolant, and consequently the cooling effect can be enhanced.

A description of one embodiment has been given above. However, the specific embodiments are not limited to the above embodiment. In the following description, configurations similar to the configuration in the above description have the same reference numbers applied thereto, and a description thereof is omitted.

Figure 11:
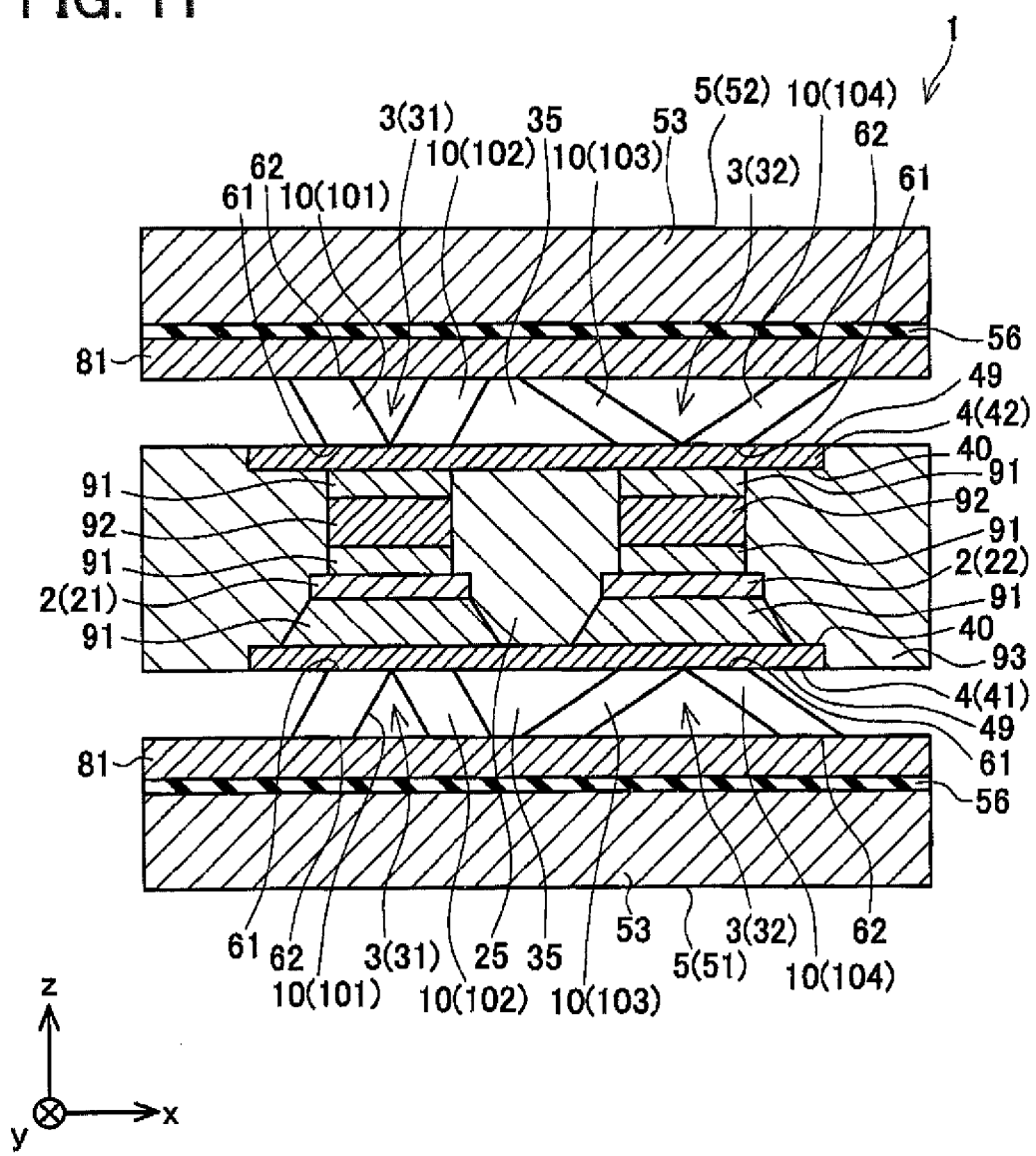
FIG. 11 is a cross-sectional view of a semiconductor device according to another embodiment.

In the above embodiment, the configuration was that end faces of the thermal diffusion members 3 at the cooler 5 side make contact with the coolers 5 via the thin films 73 and the insulating members 56, but the configuration is not limited to this. As shown in FIG. 11, a semiconductor device 1 of another embodiment may comprise metal members 81 disposed between the thermal diffusion members 3 and the coolers 5. Metal block bodies of, for example, copper (Cu), aluminum (Al), etc. can be used as the metal members 81. The metal members 81 are disposed respectively above the upper side thermal diffusion member 3 and below the lower side thermal diffusion member 3. The metal members 81 make contact with the thermal diffusion members 3 and the coolers 5. The end faces of the thermal diffusion members 3 (the first thermal diffusion members 31 and the second thermal diffusion members 32) at the cooler 5 side (the other end faces 62 of the slant members 10) make contact with the metal members 81. The coolers 5 (the first cooler 51 and the second cooler 52) make contact with the metal members 81 via the insulating members 56. The metal members 81 function as a thermal mass. According to this configuration, by providing the metal members 81, the heat can escape from the thermal diffusion members 3 to the metal members 81. The heat is stored in the metal members 81, and the coolers 5 cool these metal members 81.

Figure 12:
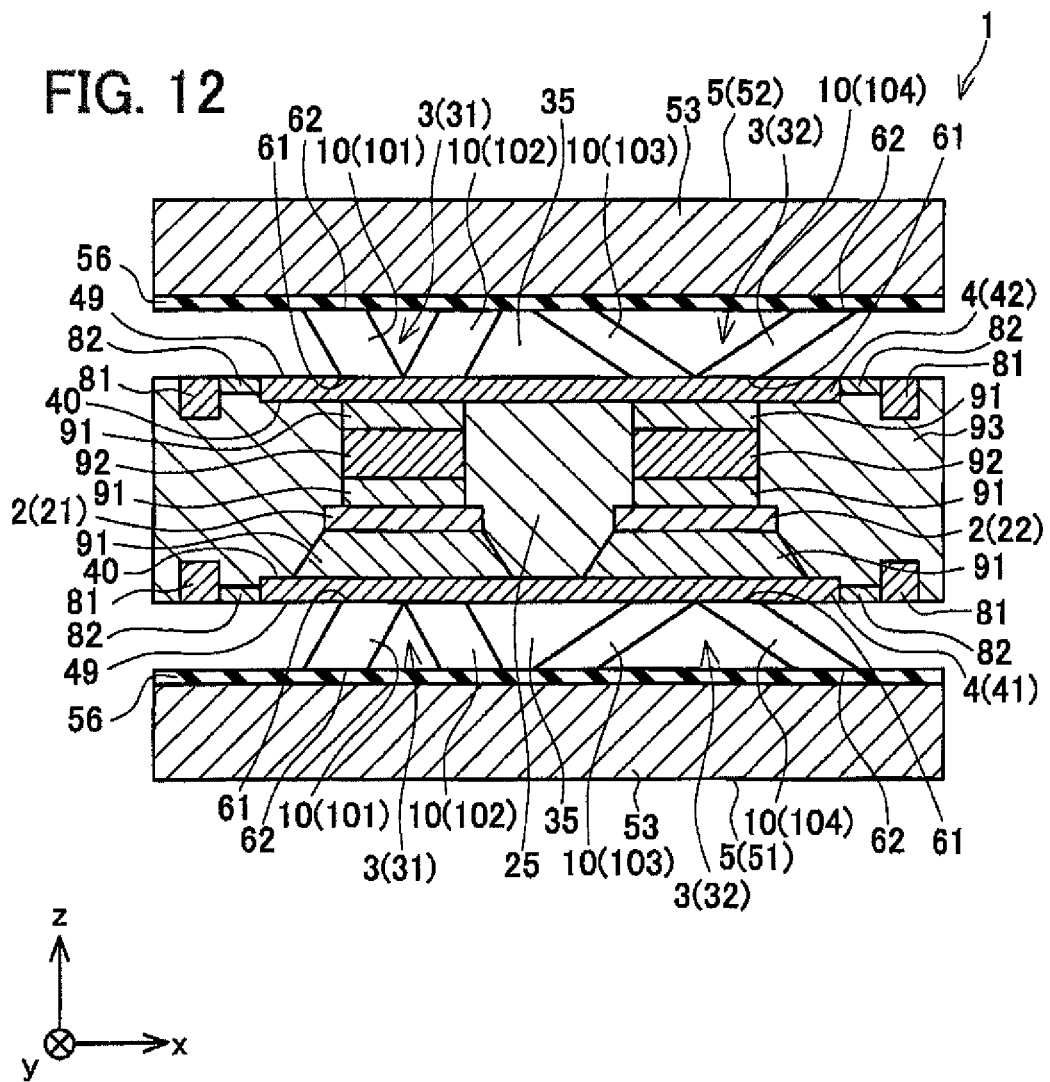
FIG. 12 is a cross-sectional view of a semiconductor device according to yet another embodiment.

In the above embodiment, the configuration was that the metal members 81 are disposed between the thermal diffusion members 3 and the coolers 5, but the configuration is not limited to this. In another embodiment, as shown in FIG. 12, a plurality of the metal members 81 may be positioned at lateral sides of the thermal radiation members 4. The metal members 81 are disposed adjacent to the thermal radiation members 4. The metal members 81 are disposed, respectively, to the left and right of the thermal radiation members 4. The metal members 81 are sealed by the sealing resin 93. The metal members 81 are disposed apart from the thermal radiation members 4. Connecting members 82 are positioned between the metal members 81 and the thermal radiation members 4. The connecting members 82 make contact with the metal members 81 and the thermal radiation members 4. The metal members 81 and the thermal radiation members 4 make contact via the connecting members 82. The connecting members 82 have thermal conductivity. Metal or carbon-based material can be used as the material of the connecting members 82. According to this configuration, by providing the metal members 81 and the connecting members 82, the heat can escape from the thermal radiation members 4 to the metal members 81 via the connecting members 82. The heat is stored in the metal members 81, which function as a thermal mass.

Figure 13:
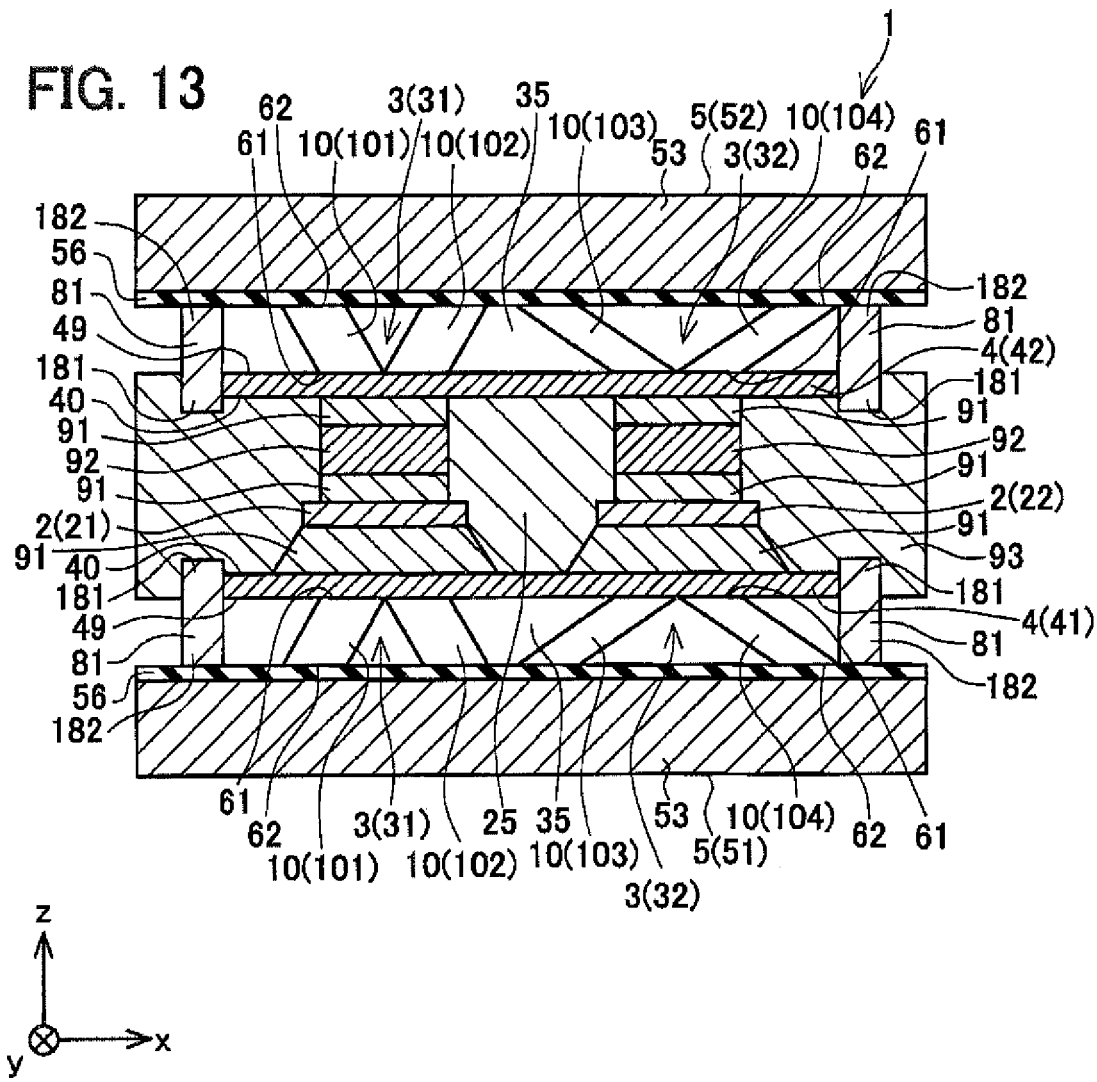
FIG. 13 is a cross-sectional view of a semiconductor device according to yet another embodiment.

In the above embodiment, the connecting members 82 were positioned between the thermal radiation members 4 and the metal members 81. However, the configuration is not limited to this and, as shown in FIG. 13, the connecting members 82 may be omitted. In the embodiment shown in FIG. 13, the metal members 81 are fixed to both end portions of the thermal radiation members 4. The thermal radiation members 4 and the metal members 81 are formed integrally. One end portion 181 of each metal member 81 is sealed by the sealing resin 93. An other end portion 182 of each metal member 81 makes contact with the cooler 5 via the insulating member 56.

Figure 14:
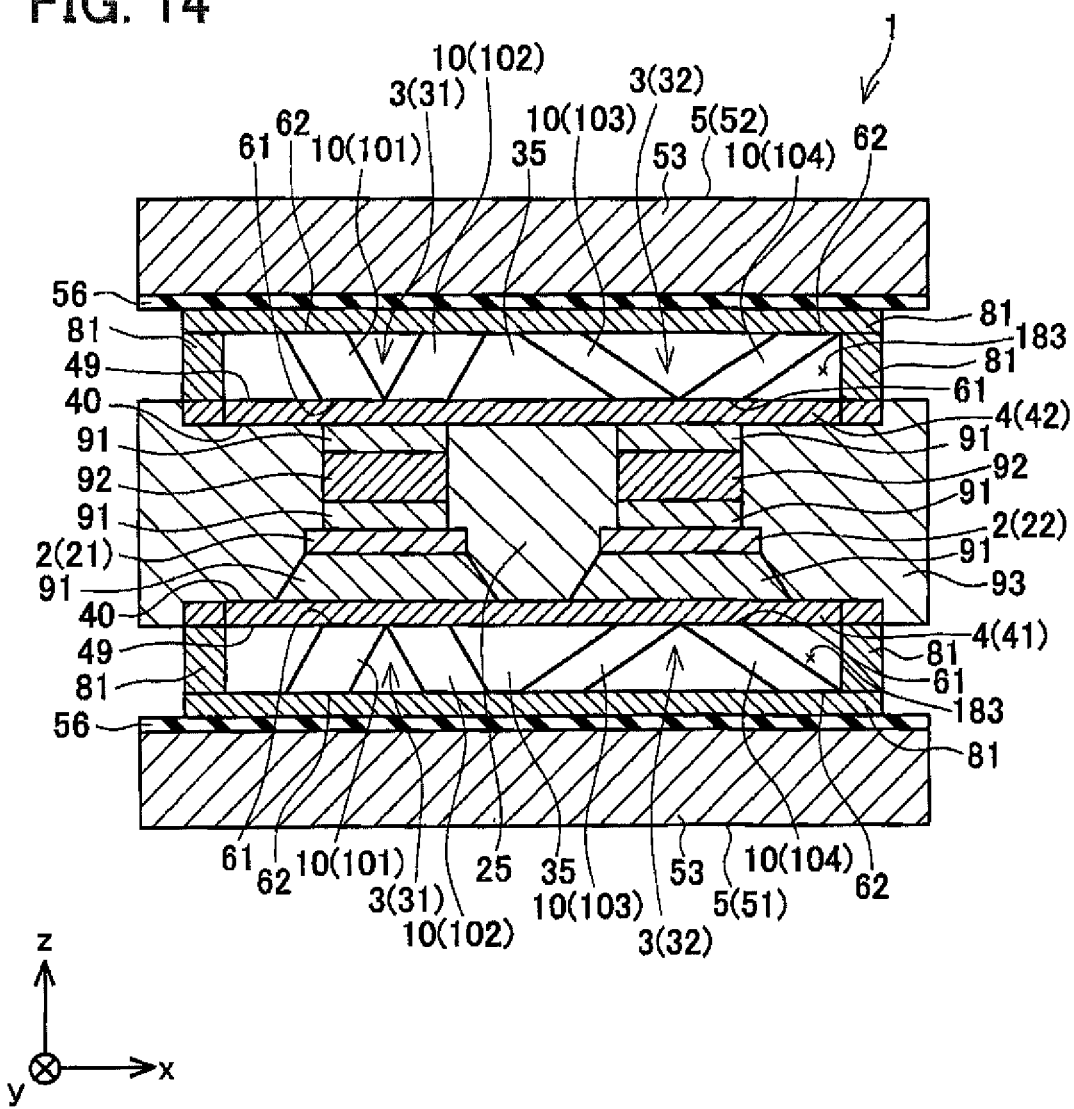
FIG. 14 is a cross-sectional view of a semiconductor device according to yet another embodiment.

Further, in yet another embodiment, as shown in FIG. 14, the metal members 81 may be disposed between the thermal diffusion members 3 and the coolers 5, and adjacent to the thermal radiation members 4. The thermal radiation members 4 and the metal members 81 are formed integrally. The metal members 81 surround the thermal diffusion members 3 (the first thermal diffusion members 31 and the second thermal diffusion members 32). Further, spaces 183 surrounded by the thermal radiation members 4 and the metal members 81 may be filled with liquid or metal powder. For example, the spaces 183 can be filled with water or liquid metal. Alternatively, the spaces 183 can be filled with copper (Cu) or aluminum (Al) powder.

Figure 15:
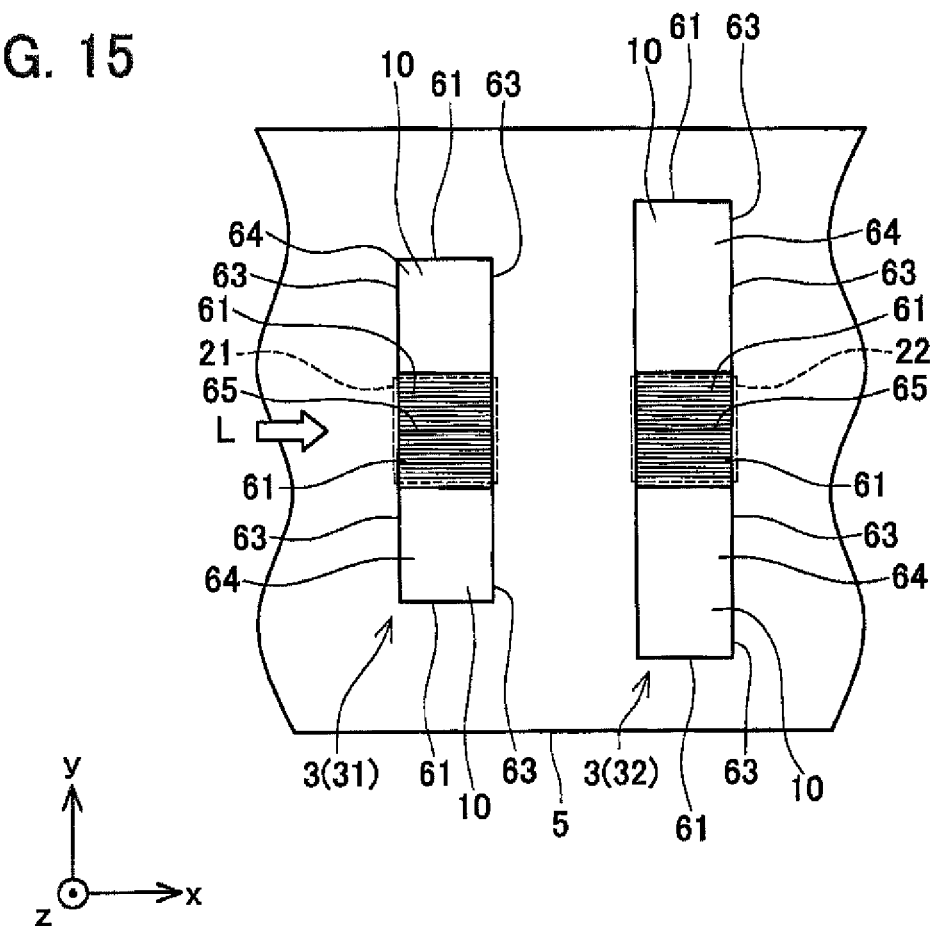
FIG. 15 is a cross-sectional view corresponding to FIG. 9 of a semiconductor device according to yet another embodiment.

Further, the number or disposition of the slant members 10 configuring the thermal diffusion members 3 is not restricted to the above embodiments. For example, as shown in FIG. 15, the first semiconductor chip 21 and the second semiconductor chip 22 can be brought closer to each other by reducing the number of slant members 10 configuring the thermal diffusion members 3. In the example shown in FIG. 15, two of the slant members 10 are disposed for the first semiconductor chip 21. The two slant members 10 for the first semiconductor chip 21 are positioned respectively above and below the first semiconductor chip 21. In FIG. 15, only the slant members 10 below the first semiconductor chip 21 are shown. Similarly, two of the slant members 10 are disposed for the second semiconductor chip 22. The two slant members 10 for the second semiconductor chip 22 are positioned respectively above and below the second semiconductor chip 22. In FIG. 15, the two slant members 10 disposed below the second semiconductor chip 22 are shown. Further, in the example shown in FIG. 15, the slant members 10 configuring the first thermal diffusion member 31 and the slant members 10 configuring the second thermal diffusion member 32 are disposed so as to extend in a direction perpendicular to the flowing direction L of the coolant. According to this configuration, the distance between the first semiconductor chip 21 and the second semiconductor chip 22 can be reduced, and the plurality of semiconductor chips 2 can be arranged at high density.

Further, there is no particular restriction on the shape of the slant members 10 configuring the thermal diffusion members 3. In the example shown in FIG. 15, the one end faces 61 and the other end faces 62 of the slant members 10 are formed in a square shape.

The coolers 5 of the above embodiments used flowing coolant, but are not limited to this configuration. Flowing coolant may not be used in the coolers 5 of another embodiment. The coolers 5 may be a heat sink or the like that does not use coolant.

In the above embodiment, the end faces of the thermal diffusion members 3 (the plurality of first thermal diffusion members 31 and the plurality of second thermal diffusion members 32) at the cooler 5 side are fixed to the coolers 5 via the insulating members 56, but are not limited to this configuration. In another embodiment, the other end faces 62 of the thermal diffusion members 3 may be in direct contact with the coolers 5.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

Some features of the present disclosure will be listed below. It should be noted that each of the features listed below is independently useful.

1. The cooler may configured to cool the first thermal diffusion member and the second thermal diffusion member by using flowing coolant. A position of an end face of the first thermal diffusion member on a cooler side and a position of an end face of the second thermal diffusion member on the cooler side do not overlap each other in a flowing direction of the coolant.

According to this configuration, it is possible to suppress coolant heated by one thermal diffusion member flowing to a position at an end face of another thermal diffusion member. Consequently, the thermal diffusion members can be cooled efficiently by the coolant.

2. Each of the first thermal diffusion member and the second thermal diffusion member may comprise a slant member extending from the thermal radiation member to the cooler in a slanted state relative to the thermal radiation member.

3. The first thermal diffusion member may comprise a first slant member extending from the thermal radiation member to the cooler in a slanted state relative to the thermal radiation member; and a second slant member extending from the thermal radiation member to the cooler in a slanted state relative to the thermal radiation member, the second slant member being positioned farther away from the first slant member on a side closer to the cooler.

4. The semiconductor device may further comprise a metal member disposed between the first and second thermal diffusion members and the cooler.

5. The semiconductor device may further comprise a metal member disposed on a lateral side of the thermal radiation member.

6. The semiconductor device may further comprise a connecting member disposed between the thermal radiation member and the metal member, and connecting the thermal radiation member and the metal member.

7. The semiconductor device may further comprise a metal member surrounding the first thermal diffusion member and the second thermal diffusion member. Liquid, powder, or a combination thereof may be filled in a space surrounded by the metal member.

8. The slant members may extend in a direction orthogonal to a flowing direction of the coolant in the cooler.

What is claimed is:

1. A semiconductor device comprising:
a first thermal radiation member made of metal and including a first surface and a second surface that is on an opposite side of the first surface;
a second thermal radiation member made of metal and including a first surface and a second surface that is on an opposite side of the first surface;
a first semiconductor chip electrically connected to the first surface of the first thermal radiation member and to the first surface of the second thermal radiation member;
a second semiconductor chip spaced from the first semiconductor chip and electrically connected to the first surface of the first thermal radiation member and to the first surface of the second thermal radiation member;
a sealing resin sealing the first semiconductor chip, the second semiconductor chip, the first surface of the first thermal radiation member, and the first surface of the second thermal radiation member between the first semiconductor chip and the second semiconductor chip, and exposing the second surfaces of the first thermal radiation member and the second thermal radiation member;
first thermal diffusion members made of carbon-based material and each respectively connected to the second surface of the first thermal radiation member and the second thermal radiation member at a position opposed to the first semiconductor chip;
second thermal diffusion members made of carbon-based material and each respectively connected to the second surface of the first thermal radiation member and the second thermal radiation member at a position opposed to the second semiconductor chip; and
coolers configured to use a coolant to cool the first thermal diffusion members and the second thermal diffusion members, and each being disposed to face the second surfaces of the first thermal radiation member and the second thermal radiation member, respectively,
wherein the first thermal diffusion members and the second thermal diffusion members, each of which are spaced from each other respectively on the second surfaces of the first thermal radiation member and the second thermal radiation member, and are disposed such that a space between each of the first thermal diffusion member and the second thermal diffusion member is positioned to oppose a space between the first semiconductor chip and the second semiconductor chip via the first thermal radiation member, the second thermal radiation member and the sealing resin.

2. The semiconductor device according to claim 1, wherein the coolers are configured to cool the first thermal diffusion members and the second thermal diffusion members by using flowing coolant, and a position of an end face of each of the first thermal diffusion members on a cooler side and a position of an end face of each of the second thermal diffusion members on the cooler side do not overlap each other in a flowing direction of the coolant.

3. The semiconductor device according to claim 1, wherein each of the first thermal diffusion members and the second thermal diffusion members comprises a slant member extending from the respective thermal radiation members towards the respective cooler in a slanted state relative to the second surface of the respective thermal radiation members.

4. The semiconductor device according to claim 3, wherein the slant members extend in a direction orthogonal to a flowing direction of the coolant in the each of the coolers.

5. The semiconductor device according to claim 1, wherein each of the first thermal diffusion members comprise:

a first slant member extending from the first thermal radiation member toward the respective cooler in a slanted state relative to the second surface of the first thermal radiation member; and a second slant member extending from the first thermal radiation member toward the respective cooler in a slanted state relative to the second surface of the first thermal radiation member, and a distance between the first slant member and the second slant member parallel to the first and second surfaces of the first thermal radiation member, the distance becoming larger on a side closer to the respective cooler.

6. The semiconductor device according to claim 1, further comprising:

a metal member disposed between each of the first and second thermal diffusion members and the respective cooler.

7. The semiconductor device according to claim 1, further comprising:

a metal member disposed on a lateral side of the first surface of the first thermal radiation member.

8. The semiconductor device according to claim 7, further comprising:

a connecting member disposed between the first or the second thermal radiation member and the metal member, and connecting the respective thermal radiation member and the metal member.

9. The semiconductor device according to claim 1, further comprising:

metal members each surrounding the first thermal diffusion member and the second thermal diffusion member; wherein liquid, powder, or a combination thereof is filled in a space surrounded by the respective metal member.

* * * * *